(12) United States Patent
Taniguchi et al.

(10) Patent No.: US 6,228,467 B1
(45) Date of Patent: May 8, 2001

(54) HEAT-RESISTANT INSULATING FILM, RAW SUBSTRATE FOR PRINTED WIRING BOARD USING THE SAME AND METHOD FOR PRODUCING THE SUBSTRATE

(75) Inventors: Kouichirou Taniguchi; Jun Takagi; Hideo Yamano, all of Nagahama; Shingetsu Yamada, Hiratsuka; Kouji Kondo; Kaoru Nomoto, both of Kariya, all of (JP)

(73) Assignees: Mitsubishi Plastics, Inc., Tokyo; Denso Corporation, Kariya, both of (JP)

( * ) Notice: Subject to any disclaimer, the term of this patent is extended or adjusted under 35 U.S.C. 154(b) by 0 days.

(21) Appl. No.: 09/381,283

(22) PCT Filed: Jan. 20, 1999

(86) PCT No.: PCT/JP99/00176

§ 371 Date: Sep. 21, 1999

§ 102(e) Date: Sep. 21, 1999

(87) PCT Pub. No.: WO99/37704

PCT Pub. Date: Jul. 29, 1999

(30) Foreign Application Priority Data

Jan. 21, 1998 (JP) .................................................. 10-009780
May 21, 1998 (JP) .................................................. 10-139273
Dec. 17, 1998 (JP) .................................................. 10-359161

(51) Int. Cl.$^7$ ....................................................... B32B 3/00
(52) U.S. Cl. ...................... 428/209; 428/320.2; 428/413; 174/258
(58) Field of Search ...................................... 420/320, 195, 420/209, 320.2, 413; 174/258

(56) References Cited

U.S. PATENT DOCUMENTS 4,687,615 * 8/1987 Kondo et al. .................... 264/290.2
5,095,078 * 3/1992 Mizuno et al. ................... 264/290.2
6,060,175 * 5/2000 Swisher ............................... 428/623

* cited by examiner

Primary Examiner—Cathy Lam
(74) Attorney, Agent, or Firm—Oblon, Spivak, McClelland, Maier & Neustadt, P.C.

(57) ABSTRACT

A base plate for a printed circuit board, having a conductive foil heat-bonded to at least one side of a film insulator which comprises from 65 to 35 wt % of a polyarylketone resin and from 35 to 65 wt % of a non-crystalline polyether imide resin and of which the glass transition temperature is from 150 to 230° C. and the peak temperature of crystal fusion is at least 260° C., as measured when the temperature is raised in the differential scanning calorimetry, if necessary after forming a through-hole and filling a conductive paste therein, and of which, after the heat bonding, the heat of crystal fusion ΔHm and the heat of crystallization ΔHc generated by crystallization during the temperature rise, as measured when the temperature is raised by the differential scanning calorimetry, satisfy the following relation:

[(ΔHm−ΔHc)/ΔHm]≦0.5.

12 Claims, 1 Drawing Sheet

HEAT-RESISTANT INSULATING FILM, RAW SUBSTRATE FOR PRINTED WIRING BOARD USING THE SAME AND METHOD FOR PRODUCING THE SUBSTRATE

TECHNICAL FIELD

The present invention relates to a heat resistant insulating film, a base plate for a printed circuit board employing it, and a method for producing the printed circuit board. More particularly, it relates to a thermoplastic resin film which is excellent in soldering heat resistance, flexibility, chemical resistance, mechanical strength and electrical properties and which is excellent also in a thermoforming property at a low temperature (a heat-bonding property), a base plate wherein this film is used as an insulator for a printed circuit board, and a method for producing the board.

BACKGROUND ART

Heretofore, as the most common printed circuit board, a board has been used wherein a prepreg (hereinafter referred to as a glass epoxy resin) obtained by impregnating a thermosetting epoxy resin to a glass cloth (a non-woven fabric of glass fibers) is used as an insulator, and a conductive foil such as a copper foil is bonded thereto by hot press molding usually under such conditions as a pressure of from 10 to 40 kgf/cm$^2$ at a temperature of from 170 to 230° C. for from 30 to 120 minutes.

The glass epoxy resin is excellent in soldering heat resistance or chemical resistance and relatively inexpensive, but it has had problems that as it contains glass fibers, cracks are likely to be imparted when an impact of dropping, etc. is exerted, thus leading to conduction failure, and it takes a long time for curing the epoxy resin during the hot press molding and thus the productivity is poor.

Further, in recent years, in correspondence with miniaturization and reduction in weight of electronic appliances including notebook personal computers and portable telephones, high densification of wirings and miniaturization and reduction in weight of circuit boards have been required, and a study on a multi-layer board using a thermoplastic resin film as an insulating layer has been actively carried out for the purpose of satisfying the requirements.

When a thermoplastic resin film is used as an insulator for a printed circuit board, various merits can be expected. As compared with a conventional glass epoxy resin, miniaturization and reduction in weight of the circuit board can be realized, the impact resistance can be improved, and the molding time for the hot press molding can be shortened, which is advantageous from the viewpoint of the productivity. Inherently, the insulator for a printed circuit board is required to have soldering heat resistance from the process of its production, and if it is possible to use a heat resistant thermoplastic resin such as a polyether ketone resin or a polyimide resin, it can be expected to obtain a circuit which is excellent in the electrical properties at a high temperature and which is reliable in a high temperature atmosphere.

However, such a heat resistant thermoplastic resin has a high temperature for molding, and it will be necessary to use an adhesive such as an epoxy resin or to carry out hot press molding at a high temperature of at least 260° C., for bonding with a conductive material or for forming a multi-layer structure for the substrate, and it takes time to raise or lower the temperature, whereby the superiority of the thermoplastic resin will be lost in the productivity. Further, in the case of a crystalline resin, the bonding property can not be obtained unless it is heated to a temperature close to the melting point, and if the temperature exceeds the melting point, the resin turns to start flowing and undergoes flow deformation. On the other hand, the polyimide resin is excellent in heat resistance, chemical resistance, mechanical strength, etc., but the hygroscopicity is large, and the dimensional stability is inadequate, and the price of the starting material is very high.

DISCLOSURE OF THE INVENTION

An object of the present invention is to provide a thermoplastic resin film which is excellent in soldering heat resistance, flexibility, chemical resistance, mechanical strength and electrical properties and which is excellent also in the thermoforming property at a low temperature (a heat bonding property) and a base plate for a printed circuit board wherein the film is used as a film insulator, and to provide an industrially advantageous method for producing a board.

The present inventors have conducted extensive studies and as a result, they have found a base plate for a printed circuit board and a method for producing a board employing it, which are capable of solving the above problems, by using a film insulator which comprises a polyarylketone resin and a non-crystalline polyether imide resin having a specific composition and which has a certain specific thermal properties imparted, and further by controlling the thermal properties of the film at the time of assembling and processing a printed circuit board within a certain specific range, and have accomplished the present invention.

Namely, the gist of the present invention resides in a heat resistant insulating film which comprises from 65 to 35 wt % of a polyarylketone resin and from 35 to 65 wt % of a non-crystalline polyether imide resin and of which the glass transition temperature is from 150 to 230° C. and the peak temperature of crystal fusion is at least 260° C., as measured when the temperature is raised by the differential scanning calorimetry, and the heat of crystal fusion ΔHm and the heat of crystallization ΔHc generated by crystallization during the temperature rise, satisfy the following relation:

$$[(\Delta Hm - \Delta Hc)/\Delta Hm] \leq 0.35$$

Further, another gist of the present invention resides in a base plate for a printed circuit board, having a conductive foil heat-bonded to at least one side of a film insulator which comprises from 65 to 35 wt % of a polyarylketone resin and from 35 to 65 wt % of a non-crystalline polyether imide resin and of which the glass transition temperature is from 150 to 230° C. and the peak temperature of crystal fusion is at least 260° C., as measured when the temperature is raised in the differential scanning calorimetry, if necessary after forming a through-hole and filling a conductive paste therein, and of which, after the heat bonding, the heat of crystal fusion ΔHm and the heat of crystallization ΔHc generated by crystallization during the temperature rise, as measured when the temperature is raised by the differential scanning calorimetry, satisfy the following relation:

$$[(\Delta Hm - \Delta Hc)/\Delta Hm] \leq 0.5$$

Furthermore, another gist of the present invention resides in a method for producing a printed circuit board, which comprises subjecting the conductive foil of the above-mentioned base plate for a printed circuit board to etching treatment required for forming a circuit, followed by heat-bonding via a film insulator to form a multi-layer structure, wherein, after the heat bonding, the heat of crystal fusion ΔHm and the heat of crystallization ΔHc, satisfy the following relation:

$[(\Delta Hm-\Delta Hc)/\Delta Hm] \geq 0.7$

According to the present invention, it is possible to provide a thermoplastic resin film which is excellent in soldering heat resistance, flexibility, chemical resistance, mechanical strength and electrical properties and which is excellent also in a thermoforming property at a low temperature (a heat bonding property), a base plate for a printed circuit board wherein this film is used as a film insulator, and a method for producing the board.

BEST MODE FOR CARRYING OUT THE INVENTION

Now, the present invention will be described in detail with reference to the accompanying drawing.

FIG. 1 is a diagrammatical view illustrating the method for producing a printed circuit board, wherein (a) shows a printed circuit board, and (b) and (c) show combinations of base materials required for the production. In the FIG. 1 is a film insulator, 2 is an electrical conductive pattern, 3 is an electrical conductive paste, and 11 to 16 are constituting base materials.

Figure 1B:
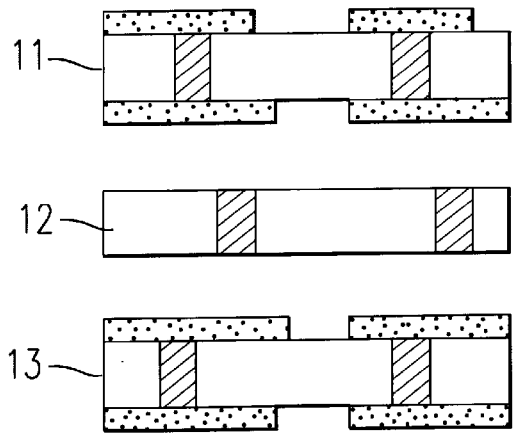
FIGS. 1(a)-(c) is a diagrammatical view illustrating the method for producing a printed circuit board.
Figure 1A:
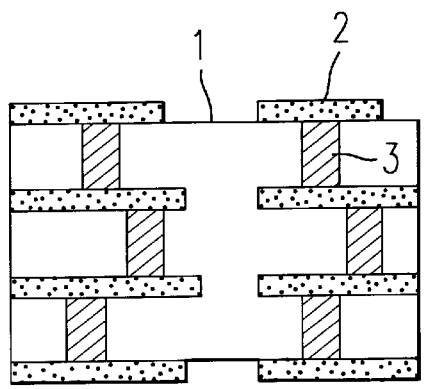

The printed circuit board shown in FIG. 1(a) is one so-called a four-layered board, wherein electrical conductive patterns (2) are formed in four layers via three sheets of a film insulator (1), and the electrical patterns are usually connected to one another by the electrical conductive paste (3). Thus, to produce such a printed circuit board, a film insulator having an electrical pattern formed or not formed on the surface, as shown in FIG. 1(b) or (c) is used as the base material (11) to (16).

Here, a four-layered board is illustrated, but in the same manner, a board having six layers or more can be prepared.

In the combination of FIG. 1(b), two base materials (11) and (13) having electrical conductive patterns formed on both sides, and a base material (12) having no electrical conductive pattern on its surface, are used. Namely, the base materials (11) and (13) are obtainable by firstly providing prescribed through-holes in the film insulators and filling an electrically conductive paste therein, and then heat-bonding a conductive foil such as a copper foil to both sides to obtain base plates for a printed circuit board (referred to also as "double side coppered plates"), followed by etching treatment to form the respectively prescribed circuit patterns on the four-surfaces. On the other hand, a base material (12) made of a film insulator having predetermined through-holes provided and an electrical conductive paste filled therein, is prepared, and the above-mentioned base materials (11) and (13) are heat-bonded with it interposed to form a multilayer structure to obtain a printed circuit board of FIG. 1(a).

Figure 1C:
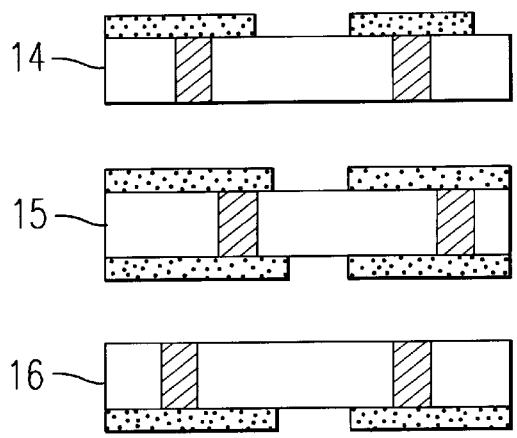

Further, in the combination of FIG. 1(c), two base materials (14) and (16) having an electrical conductive pattern formed on one side, and a base material (15) having electrical conductive patterns formed on both sides, are employed. In this case, a conductive foil is heat-bonded to one side or both sides of a film insulator having predetermined through-holes provided and an electrical conductive paste filled therein, to prepare a base plate for a printed circuit board, followed by etching treatment to form the respectively prescribed circuit patterns on the four-surfaces, to obtain base materials (14) to (16), and they are overlaid one on another and heat-bonded to form a multi-layer structure, to obtain a printed circuit board of FIG. 1(a).

In the present invention, the polyarylketone resin as the first component constituting the film insulator (1), is a thermoplastic resin containing an aromatic nucleus bond, an ether bond and a ketone bond as its structural units, and its typical examples include a polyether ketone, a polyether ether ketone and a polyether ketone ketone. However, in the present invention, a polyether ether ketone shown by the following Formula (1), is preferably employed.

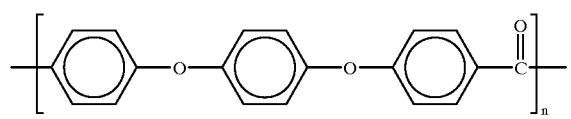
(1)

On the other hand, the non-crystalline polyether imide resin as the second component constituting the film insulator (1) is a non-crystalline thermoplastic resin containing an aromatic nucleus bond, an ether bond and an imide bond as its structural units, and in the present invention, a polyether imide shown by the following Formula (2) is preferably employed.

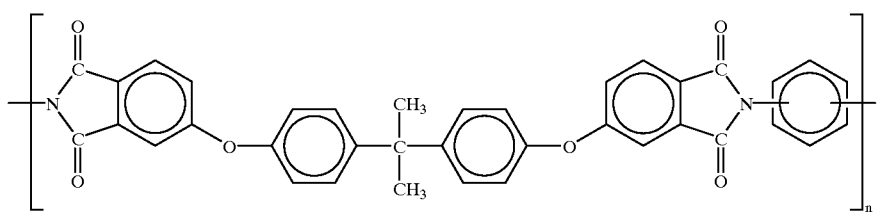
(2)

Further, in the present invention, the film insulator is required to have a certain specific composition and physical properties. Namely, it is required to have a composition comprising from 65 to 35 wt % of the above polyarylketone resin and from 35 to 65 wt % of the above non-crystalline polyether imide resin, and it is required that the glass transition temperature is from 150 to 230° C. and the peak temperature for crystal fusion is at least 260° C., as measured when the temperature is raised by a differential scanning calorimetry, and the heat of crystal fusion ΔHm and the heat of crystallization ΔHc generated by crystallization during the temperature rise, satisfy the following relation:

$[(\Delta Hm-\Delta Hc)/\Delta Hm] \leq 0.35$

If the above polyarylketone resin exceeds 65 wt %, or the non-crystalline polyether imide resin is less than 35 wt %, the composition as a whole tends to have high crystallizability, and the crystallization speed tends to be too high, whereby at the time of bonding to the conductive foil by heat fusion, crystallization is likely to proceed excessively, and it tends to be difficult to form a multilayer structure of the board by heat-bonding, or the volume shrinkage (the dimensional change) due to crystallization tends to be large, and the reliability as a circuit board tends to be low, such being undesirable. Further, if the crystalline polyarylketone resin is less than 35 wt %, or the non-crystalline polyether imide resin exceeds 65 wt %, the composition as a whole tends to have low crystallizability, or the crystallization speed tends to be too slow, and even if the peak temperature of crystal fusion is at least 260° C., the soldering heat resistance tends to be low, such being undesirable.

Further, if the glass transition temperature of the film insulator is lower than 150° C., the heat resistance tends to be low. On the other hand, if it exceeds 230° C., at the time of carrying out bonding to the conductive foil by heat bonding at a low temperature of at most 250° C., the elastic modulus of the film will not decrease very much, whereby it tends to be difficult to obtain adequate bond strength. Further, if the peak temperature for crystal fusion is lower than 260° C., the soldering heat resistance tends to be low, such being undesirable.

Thus, the thermal property as the most important control factor in the present invention, is represented by the following relation between the heat of crystal fusion ΔHm of the film insulator and the heat of crystallization ΔHc generated by crystallization during the temperature rise:

$$[(\Delta Hm - \Delta Hc)/\Delta Hm]$$

Namely, this thermal property is calculated by the above formula from the measured values of two transition heats appearing in the DSC curve when the temperature is raised in a differential scanning calorimetry in accordance with JIS K7121 and JIS K7122, i.e. the values of the heat of crystal fusion ΔHm (J/g) and the heat of crystallization ΔHc (J/g).

The value of this relation [(ΔHm−ΔHc)/ΔHm] depends also on the type and the molecular weight of the starting material polymer, the proportions of the composition, etc., but it largely depends on the forming and processing conditions of the film insulator. Namely, the numerical value can be controlled to be small by readily cooling the starting material polymer after melting it at the time of forming it into a film. Further, such a numerical value can be controlled by adjusting the heat history in each step. The heat history means the temperature of the film insulator and the time maintained at that temperature, and said numerical value tends to be large as the temperature is high or the time is long.

With the above-mentioned film insulator, if this value exceeds 0.35, the degree of crystallization before bonding to the conductive foil by heat bonding is already high, whereby it will be required to carry out the bonding to the conductive foil by heat bonding at a high temperature, or crystallization is likely to proceed excessively at the time of bonding to the conductive foil by heat bonding, so that it will be difficult to form a multilayer structure of the board by heat bonding.

Next, the most important in the manner of control of this relation is that in the process for producing a printed circuit board, firstly, with respect to a base plate for a printed circuit board having a conductive foil heat-bonded on at least one side of a film insulator, the values based on the measurements after the heat-bonding satisfy the following relation:

$$[(\Delta Hm - \Delta Hc)/\Delta Hm] \leq 0.5$$

If this value exceeds 0.5, the bonding property by the heat bonding in the process for forming a multilayer structure of the board, tends to be poor, whereby it will be difficult to form a multilayer structure. Likewise, also with respect to the film insulator before the heat bonding to the conductive foil, the value of the above relation should better be as small as possible. For example, if the value exceeds 0.35 before the heat-bonding, the crystallization before bonding to the conductive foil by heat-bonding is already high, whereby it will be required to carry out the bonding to the conductive foil by heat-bonding at a high temperature, or the crystallization tends to proceed excessively at the time of bonding to the conductive foil by heat-bonding, so that it will be difficult to form a multilayer structure of the board by heat-bonding.

Finally, to realize the soldering heat resistance after formation of a multilayer structure, with respect to a printed circuit board multi-layered by heat-bonding the above base plates for a print circuit board via a film insulator, the values based on the measurement after the heat-bonding, satisfy the following relation:

$$[(\Delta Hm - \Delta Hc)/\Delta Hm] \geq 0.7$$

If this value is less than 0.7, the crystallization tends to be inadequate, and the soldering heat resistance tends to be low, such being undesirable.

In the present invention, to the resin composition constituting the film insulator, other resins or additives, for example, various additives such as a heat stabilizer, an ultraviolet absorber, a photostabilizer, a nucleating agent, a coloring agent, a lubricant, a flame retardant, a filler such as an inorganic filler, may be optionally incorporated to such an extent not to impair the nature of the composition. Further, embossing or corona treatment may, for example, be applied to the surface of the film insulator in order to improve the handling efficiency.

The film forming method for the film insulator is not particularly limited, and a known method such as an extrusion casting method employing a T-die or a calendar method may, for example, be employed. However, from the viewpoint of the film forming property of the sheet, the stabilized productivity, etc., preferred is an extrusion casting method employing a T-die. The forming temperature by the extrusion casting method employing a T-die is suitably adjusted depending upon the film forming property or the flow property of the composition, but is generally at least the melting point and at most 430° C. Further, the thickness of the film is usually from 25 to 300 μm.

The conductive foil to be used in the present invention may be a metal foil of e.g. copper, gold, silver, aluminum, nickel or tin, having a thickness of about 5 to 70 μm. As the metal foil, a copper foil is usually employed, and one having the surface treated by chemical conversion treatment such as black oxidation treatment, is preferably employed.

As the heat bonding method in the method for producing a printed circuit board, a known method may be employed so long as it is a method capable of heating and pressing, and it is not particularly limited. For example, a hot press method or a thermolaminating roll method, or a method having these combined, may suitably be employed.

In the foregoing, the heat resistant insulating film of the present invention has been described with respect to the use as a film insulator, particularly for the production of a printed circuit board. However, the film is also useful for other heat resistant laminates. In such a case, base materials to be laminated may, for example, be 1) a metal plate of e.g. copper, gold, silver, aluminum, nickel, tin or zinc, 2) a ceramic such as zirconium oxide, zirconium silicate, aluminum oxide, silicone nitride, silicone carbide, boron oxide, yttrium oxide or barium titanate, and 3) an aryl type engineering plastic such as a crystalline polyether ether ketone, a polyether imide, a polyimide or a polyether sulfone.

Now, the present invention will be described in further detail with reference to Examples. However, the present invention is by no means restricted by such Examples. Further, various measurements and evaluations with respect to films shown in this specification, were carried out as follows.

(1) Glass Transition Temperature, Crystallization Temperature, Peak Temperature for Crystal Fusion Obtained from the thermogram when 10 mg of a sample was heated at a heating rate of 10° C./min in accordance with JIS K7121 by means of DSC-7, manufactured by Perkin Elmer K.K.

(2) $(\Delta Hm - \Delta Hc)/\Delta Hm$

Calculated by obtaining the heat of crystal fusion $\Delta Hm$ (J/g) and the heat of crystallization $\Delta Hc$ (J/g) from the thermogram when 10 mg of a sample was heated at a heating rate of 10° C./min in accordance with JIS K7122 by means of DSC-7, manufactured by Perkin Elmer K.K.

(3) Bond Strength

In accordance with normal peel strength as prescribed in JIS C6481, copper foils on both sides were respectively measured, and the average value was represented by kgf/cm.

(4) Soldering Heat Resistance

In accordance with the normal soldering heat resistance as prescribed in JIS C6481, a test specimen was floated on a solder bath of 260° C. for 10 seconds so that the copper foil side was in contact with the solder bath, and after cooling it to room temperature, presence of absence of blistering or peeling was visually inspected to determine good or bad.

EXAMPLE 1

A mixture composition comprising 60 wt % of a polyether ether ketone resin [PEEK381G, manufactured by Victrex Company] (hereinafter may be referred to simply as PEEK) and 40 wt % of a polyether imide resin [Ultem-1000, manufactured by General Electric Company] (hereinafter may be referred to simply as PEI), was extruded by means of a 40 mm$\phi$ twin screw kneading extruder (L/D=35) equipped with a T-die, manufactured by Mitsubishi Heavy Industries, Ltd., and immediately contacted to a casting roll provided with a temperature controlling function, for solidification, to obtain a film insulator having a thickness of 100 μm. The extrusion conditions were as follows.

| | |
|---|---|
| Extrusion set temperature: | 390–410° C. |
| Extruding amount: | 20 Kg/hr |
| Cast roll temperature: | 150° C. |

EXAMPLE 2

A film insulator was obtained in the same manner as in Example 1 except that the proportions of the mixed composition were changed to 40 wt % of the polyether ether ketone resin and 60 wt % of the polyether imide resin.

REFERENCE EXAMPLES 1 to 3

A film insulator was obtained in the same manner as in Example 1 except that the proportions of the mixed composition were changed, respectively, to 100 wt % of the polyether ether ketone resin (Reference Example 1), to 30 wt % of the polyether ether ketone resin and 70 wt % of the polyether imide resin (Reference Example 2), and to 100 wt % of the polyether imide resin (Reference Example 3).

Then, with respect to the film insulators obtained in the above Examples and Reference Examples, the glass transition temperatures, the crystallization temperatures, the heat of crystallization $\Delta Hc$, the peak temperatures of crystal fusion, and the heat of crystal fusion $\Delta Hm$, were measured, and $(\Delta Hm - \Delta Hc)/\Delta Hm$ was calculated. The results are summarized in Table 1.

TABLE 1

| | Ref. Ex. 1 | Ex. 1 | Ex. 2 | Ref. Ex. 2 | Ref. Ex. 3 |
|---|---|---|---|---|---|
| PEEK (wt %) | 100 | 60 | 40 | 30 | 0 |
| PEI (wt %) | 0 | 40 | 60 | 70 | 100 |
| Physical properties of films | | | | | |
| Glass transition temperature (° C.) | 139 | 166 | 186 | 192 | 216 |
| Crystallization temperature (° C.) | 170 | 214 | 248 | 249 | — |
| Heat of crystallization $\Delta Hc$ (J/g) | 29 | 22.5 | 15.3 | 13.8 | — |
| Peak temperature of crystal fusion (° C.) | 343 | 342 | 341 | 340 | — |
| Heat of crystal fusion $\Delta Hm$ (J/g) | 48 | 30.4 | 15.7 | 14.4 | — |
| $(\Delta Hm - \Delta Hc)/\Delta Hm$ | 0.40 | 0.26 | 0.03 | 0.04 | — |

EXAMPLE 3

The film insulator obtained in Example 1 was cut into A4 size, and an electrolytic copper foil having a thickness of 18 μm was laminated on each side and bonded by a hot press under such conditions that the pressure 2 was 30 kgf/cm$^2$, the temperature was 200° C. and the time was 10 minuets, to obtain a double side coppered plate. Further, a circuit was formed by etching. Then, between a pair of such double side coppered plates formed with circuits, a fresh film insulator was laminated and formed into a multi-layer structure by a hot press under such conditions that the pressure was 30 kgf/cm$^2$, the temperature was 220° C. and the time was 20 minutes, to obtain a four-layered board.

There was no such problem as peeling of the copper foils during the processing step, and the obtained four-layered board was adequate in the interlaminar adhesion and the bond strength with the copper foils, and the soldering heat resistance was also good.

COMPARATIVE EXAMPLE 1

A four-layered board was prepared in the same manner as in Example 3, except that the hot pressing temperature at the time of preparing the double side coppered plate was changed to 215° C.

The obtained four-layered board was inadequate in the interlaminar adhesion, and was easily peeled.

EXAMPLE 4

A four-layered board was prepared in the same manner as in Example 3 except that the film insulator obtained in Example 1 was changed to the film insulator obtained in Example 2, and the hot press temperature at the time of preparing the double side coppered plate was changed to 225° C., and the hot press conditions at the time of preparing the four-layered board were changed to a temperature of 240° C. and a time of 30 minutes.

There was no such problem as peeling of the copper foil in the processing step, and the obtained four-layered board was adequate in the interlaminar adhesion and the bond strength to a copper foil, and the soldering heat resistance was also good.

COMPARATIVE EXAMPLE 2

A four-layered board was prepared in the same manner as in Example 4 except that the hot press conditions at the time of preparing the four-layered board were changed to a temperature of 230° C. and a time of 10 minutes.

With the obtained four-layered board, the interlaminar adhesion was good, but the soldering heat resistance was poor.

COMPARATIVE EXAMPLE 3

A double side coppered plate was prepared in the same manner as in Example 3 except that the film insulator obtained in Example 1 was changed to the film insulator obtained in Reference Example 2, and the hot press conditions at the time of preparing the double side coppered plate were changed to a temperature of 240° C. and a time of 20 minutes.

The evaluation results with respect to the double side coppered plates and the four-layered boards obtained in these Examples and Comparative Examples, are summarized in Table 2.

TABLE 2

|  | Ex. 3 | Ex. 4 | Comp. Ex. 1 | Comp. Ex. 2 | Comp. Ex. 3 |
|---|---|---|---|---|---|
| PEEK (wt %) | 60 | 40 | 60 | 40 | 30 |
| PEI (wt %) | 40 | 60 | 40 | 60 | 70 |
| Double side coppered plate |  |  |  |  |  |
| Hot press temperature (° C.) | 200 | 225 | 215 | 225 | 240 |
| Hot press time (min) | 10 | 10 | 10 | 10 | 20 |
| Bond strength (kgf/cm) | 0.7 | 0.6 | 1.0 | 0.6 | 0.2 |
| (ΔHm − ΔHc)/ΔHm | 0.31 | 0.38 | 0.78 | 0.38 | 0.66 |
| Four-layered board |  |  |  |  |  |
| Hot press temperature (° C.) | 220 | 240 | 220 | 230 | — |
| Hot press time (min) | 20 | 30 | 20 | 10 | — |
| Bond strength (kgf/cm) | 1.5 | 1.3 | — | 0.9 | — |
| (ΔHm − ΔHc)/ΔHm | 0.96 | 0.93 | — | 0.63 | — |
| Soldering heat resistance | Good | Good | — | Bad | — |

From Examples 1 to 4 in Tables 1 and 2, it is evident that the starting material compositions for the film insulators are within the prescribed ranges, and when they have the specific thermal properties, lamination with a conductive foil at a low temperature (at most 250° C.) is possible, and it is possible to form a multilayer structure at a low temperature (at most 250° C.) if at the time of preparing the multi-layered board, the value of (ΔHm−ΔHc)/ΔHm is controlled to be at most 0.5 after the step of bonding to the conductive foil by heat bonding and to be at least 0.7 after the step of forming a multilayer structure of the board, and the soldering heat resistance is good. On the other hand, it is evident that as in Comparative Examples 1 and 2, if the value of (ΔHm−ΔHc)/ΔHm is not adjusted within the prescribed range at the time of preparing the multi-layered board, it will be difficult to form a multi-layer structure, and the soldering heat resistance becomes poor. Further, it is evident that as in Comparative Example 3, in a case where the composition of starting materials for the film insulator is outside the prescribed ranges, the bond strength between the copper foil and the double side coppered plate obtained is poor, and it is difficult to form a multi-layer structure.

What is claimed is:

1. A heat resistant insulating film which comprises from 65 to 35 wt % of a polyarylketone resin and from 35 to 65 wt % of a non-crystalline polyether imide resin and of which the glass transition temperature is from 150 to 230° C. and the peak temperature of crystal fusion is at least 260° C., as measured when the temperature is raised by the differential scanning calorimetry, and the heat of crystal fusion ΔHm and the heat of crystallization ΔHc generated by crystallization during the temperature rise, satisfy the following relation:

$$[(\Delta Hm - \Delta Hc)/\Delta Hm] \leq 0.35.$$

2. A base plate for a printed circuit board, having a conductive foil heat-bonded to at least one side of a film insulator which comprises from 65 to 35 wt % of a polyarylketone resin and from 35 to 65 wt % of a non-crystalline polyether imide resin and of which the glass transition temperature is from 150 to 230° C. and the peak temperature of crystal fusion is at least 260° C., as measured when the temperature is raised in the differential scanning calorimetry, if necessary after forming a through-hole and filling a conductive paste therein, and of which, after the heat bonding, the heat of crystal fusion ΔHm and the heat of crystallization ΔHc generated by crystallization during the temperature rise, as measured when the temperature is raised by the differential scanning calorimetry, satisfy the following relation:

$$[(\Delta Hm - \Delta Hc)/\Delta Hm] \leq 0.5.$$

3. The base plate for a printed circuit board according to claim 2, wherein the polyarylketone resin is a polyether ether ketone resin.

4. A method for producing a printed circuit board, which comprises subjecting the conductive foil of the base plate for a printed circuit board obtained by the method as defined in claim 3 to etching treatment required for forming a circuit, followed by heat-bonding via a film insulator to form a multi-layer structure, wherein, after the heat bonding, the heat of crystal fusion ΔHm and the heat of crystallization ΔHc satisfy the following relation:

$$[(\Delta Hm - \Delta Hc)/\Delta Hm] \geq 0.7.$$

5. The method for producing a printed circuit board according to claim 4, wherein each of the heat bonding of the film insulator and the conductive foil and the heat bonding at the time of forming the multi-layer structure is carried out at a temperature of at most 250° C.

6. A method for producing a base plate for a printed circuit board, which comprises heat-bonding a conductive foil to at least one side of a film insulator which comprises from 65 to 35 wt % of a polyarylketone resin and from 35 to 65 wt % of a non-crystalline polyether imide resin and of which the glass transition temperature is from 150 to 230° C. and the peak temperature of crystal fusion is at least 260° C., as measured when the temperature is raised in the differential scanning calorimetry, if necessary after forming a through-hole and filling a conductive paste therein, wherein, after the heat bonding, the heat of crystal fusion ΔHm and the heat of crystallization ΔHc generated by crystallization during the temperature rise, as measured when the temperature is raised by the differential scanning calorimetry, satisfy the following relation:

$$[(\Delta Hm - \Delta Hc)/\Delta Hm] \leq 0.5.$$

7. The method for producing a base plate for a printed circuit board according to claim 6, wherein the heat-bonding of the film insulator and the conductive foil is carried out at a temperature of at least the glass transition temperature of the film insulator and lower than the crystallization temperature.

8. A method for producing a printed circuit board, which comprises subjecting the conductive foil of the base plate for a printed circuit board obtained by the method as defined in claim 7 to etching treatment required for forming a circuit, followed by heat-bonding via a film insulator to form a multi-layer structure, wherein, after the heat bonding, the heat of crystal fusion ΔHm and the heat of crystallization ΔHc satisfy the following relation:

$$[(\Delta Hm - \Delta Hc)/\Delta Hm] \geq 0.7.$$

9. The method for producing a printed circuit board according to claim 8, wherein each of the heat bonding of the film insulator and the conductive foil and the heat bonding at the time of forming the multi-layer structure is carried out at a temperature of at most 250° C.

10. A heat resistant insulating film obtained by:

i) forming a resin composition by mixing 65 to 35 wt. % of a polyarylketone resin and from 35 to 65 wt % of a non-crystalline polyether imide resin; and ii) forming a film from said resin composition, wherein said film has a glass transition temperature of from 150 to 230° C. and a peak temperature of crystal fusion of at least 260° C., as measured when the temperature is raised by the differential scanning calorimetry, and the heat of crystal fusion ΔHm and the heat of crystallization ΔHc generated by crystallization during the temperature rise, satisfy the following relation:

$$[(\Delta Hm - \Delta Hc)/\Delta Hm] \leq 0.35.$$

11. A method for producing a printed circuit board, which comprises subjecting the conductive foil of the base plate for a printed circuit board obtained by the method as defined in claim 6 to etching treatment required for forming a circuit, followed by heat-bonding via a film insulator to form a multi-layer structure, wherein, after the heat bonding, the heat of crystal fusion ΔHm and the heat of crystallization ΔHc satisfy the following relation:

$$[(\Delta Hm - \Delta Hc)/\Delta Hm] \geq 0.7.$$

12. The method for producing a printed circuit board according to claim 11, wherein each of the heat bonding of the film insulator and the conductive foil and the heat bonding at the time of forming the multi-layer structure is carried out at a temperature of at most 250° C.

* * * * *